(12) United States Patent
Joo et al.

(10) Patent No.: US 10,219,382 B2
(45) Date of Patent: Feb. 26, 2019

(54) CLAMP AND DISPLAY DEVICE INCLUDING SAME

(71) Applicant: SAMSUNG ELECTRONICS CO., LTD., Suwon-si (KR)

(72) Inventors: Sung Yong Joo, Yongin-si (KR); Jin Hyung Lee, Anyang-si (KR); Gil Yong Chang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/302,769

(22) PCT Filed: Apr. 7, 2015

(86) PCT No.: PCT/KR2015/003493
§ 371 (c)(1),
(2) Date: Oct. 7, 2016

(87) PCT Pub. No.: WO2015/156591
PCT Pub. Date: Oct. 15, 2015

(65) Prior Publication Data
US 2017/0042032 A1 Feb. 9, 2017

(30) Foreign Application Priority Data

Apr. 8, 2014 (KR) .................. 10-2014-0041796
Apr. 7, 2015 (KR) .................. 10-2015-0049309

(51) Int. Cl.
*H05K 5/00* (2006.01)
*H05K 1/18* (2006.01)
(Continued)

(52) U.S. Cl.
CPC ............... *H05K 1/182* (2013.01); *H01G 2/06* (2013.01); *H05K 3/301* (2013.01); *H05K 7/12* (2013.01);
(Continued)

(58) Field of Classification Search
CPC ............ H05K 1/182; H05K 7/12; H05K 2201/10128; H05K 2201/10393; H01G 2/06; G02F 1/133308; G02F 1/133385
(Continued)

(56) References Cited

U.S. PATENT DOCUMENTS 3,154,281 A * 10/1964 Frank .................. F16B 21/06
174/138 G
4,564,163 A * 1/1986 Barnett .................. F16L 3/12
24/16 PB
(Continued)

FOREIGN PATENT DOCUMENTS

JP 2012-037841 A 2/2012
KR 10-1994-0026584 A 12/1994
(Continued)

OTHER PUBLICATIONS

International Search Report (PCT/ISA/210) dated Jul. 24, 2015 issued by the International Searching Authority in counterpart International Application No. PCT/KR2015/003493.
(Continued)

*Primary Examiner* — Hung S. Bui
(74) *Attorney, Agent, or Firm* — Sughrue Mion, PLLC

(57) ABSTRACT

According to an embodiment of the present disclosure, since the electronic components are fixed on the PCB by the clamp, post processing, such as soldering or application of an adhesive, may be not needed. Also, since the PCB can be spaced from the adjacent configurations by the clamp, the efficient layout of the PCB is possible, resulting in an improvement of productivity of the PCB. In accordance with an aspect of the present disclosure, there is provided a clamp comprises a fixing part configured to surround at least one part of the outer surface of an electronic component, a connection part extending from the fixing part, and penetrating a Printed Circuit Board (PCB), an interference part (Continued)

provided in at least one of the fixing part or the connection part, and configured to be interfered by the PCB and a spacing part protruding from at least one of the connection part or the fixing part.

14 Claims, 10 Drawing Sheets

(51) Int. Cl.
H05K 7/12 (2006.01)
H01G 2/06 (2006.01)
H05K 3/30 (2006.01)
G02F 1/1333 (2006.01)

(52) U.S. Cl.
CPC .. *G02F 1/133308* (2013.01); *G02F 1/133385* (2013.01); *G02F 2001/13332* (2013.01); *G02F 2001/133314* (2013.01); *G02F 2001/133317* (2013.01); *H05K 3/306* (2013.01); *H05K 2201/10128* (2013.01); *H05K 2201/10393* (2013.01); *H05K 2201/10583* (2013.01); *H05K 2201/10651* (2013.01); *H05K 2201/2036* (2013.01)

(58) Field of Classification Search
USPC .......................................... 361/728–730, 732
See application file for complete search history.

(56) References Cited

U.S. PATENT DOCUMENTS

| | | | | | |
|---|---|---|---|---|---|
| 4,567,546 | A | * | 1/1986 | Zeller | F16B 21/088 174/138 D |
| 4,627,760 | A | * | 12/1986 | Yagi | F16B 5/0614 174/138 D |
| 4,681,288 | A | * | 7/1987 | Nakamura | F16B 5/065 24/453 |
| 4,806,895 | A | * | 2/1989 | Petrow | H05K 3/301 248/500 |
| 4,917,340 | A | * | 4/1990 | Juemann | F16L 3/13 248/74.2 |
| 5,117,330 | A | * | 5/1992 | Miazga | H05K 3/301 174/138 G |
| 5,704,573 | A | * | 1/1998 | de Beers | F16L 3/13 248/73 |
| 6,751,103 | B1 | * | 6/2004 | Sivertsen | H01M 2/1016 361/825 |
| 6,926,237 | B2 | * | 8/2005 | Shereyk | F16B 5/0685 248/71 |
| 7,045,715 | B2 | * | 5/2006 | Ono | B60R 16/0215 174/135 |
| 7,269,026 | B2 | * | 9/2007 | Jeong | H05K 1/148 174/351 |
| 7,301,782 | B2 | * | 11/2007 | Lee | H01R 13/639 361/715 |
| 7,435,904 | B2 | * | 10/2008 | Peterson | H02G 3/00 174/135 |
| 7,753,320 | B2 | * | 7/2010 | Geiger | F16B 21/084 248/68.1 |
| 7,857,668 | B2 | * | 12/2010 | Henderson | H01G 2/06 439/500 |
| 8,184,446 | B2 | * | 5/2012 | Jang | H05K 1/182 361/679.21 |
| 9,109,617 | B2 | * | 8/2015 | Diep | F16L 3/1075 |
| 2003/0189140 | A1 | * | 10/2003 | Takeuchi | F16B 21/084 248/71 |

FOREIGN PATENT DOCUMENTS

| | | |
|---|---|---|
| KR | 20-1999-0005400 U | 2/1999 |
| KR | 10-2006-0034437 A | 4/2006 |
| KR | 10-2009-0080009 A | 7/2009 |

OTHER PUBLICATIONS

Written Opinion (PCT/ISA/237) dated Jul. 24, 2015 issued by the International Searching Authority in counterpart International Application No. PCT/KR2015/003493.

* cited by examiner

[Fig. 1]
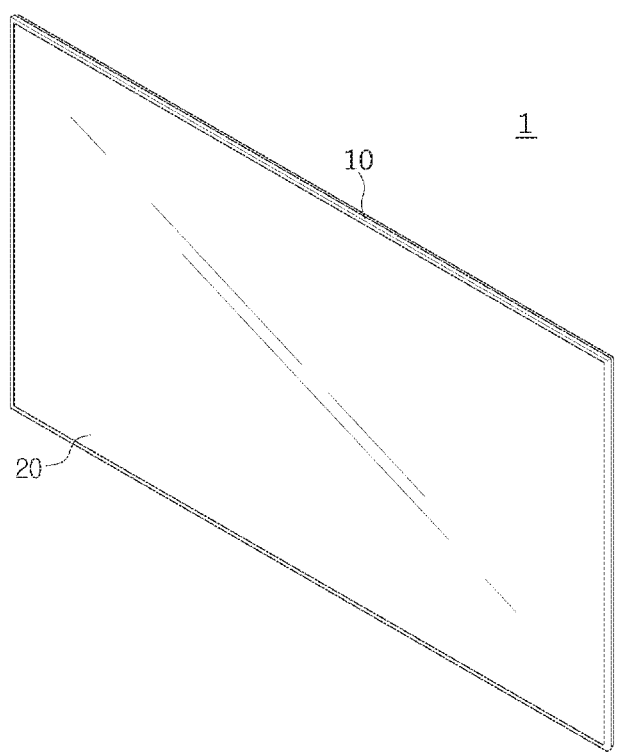

[Fig. 2]
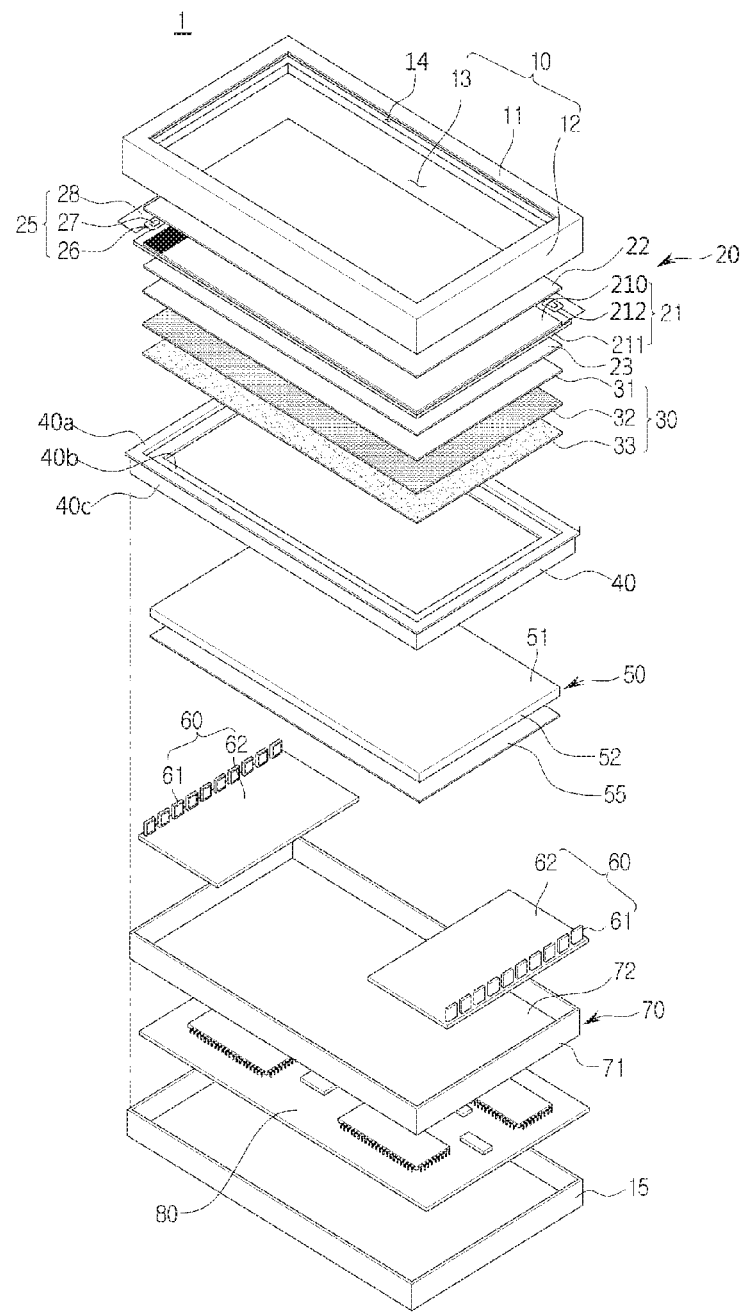

[Fig. 3]
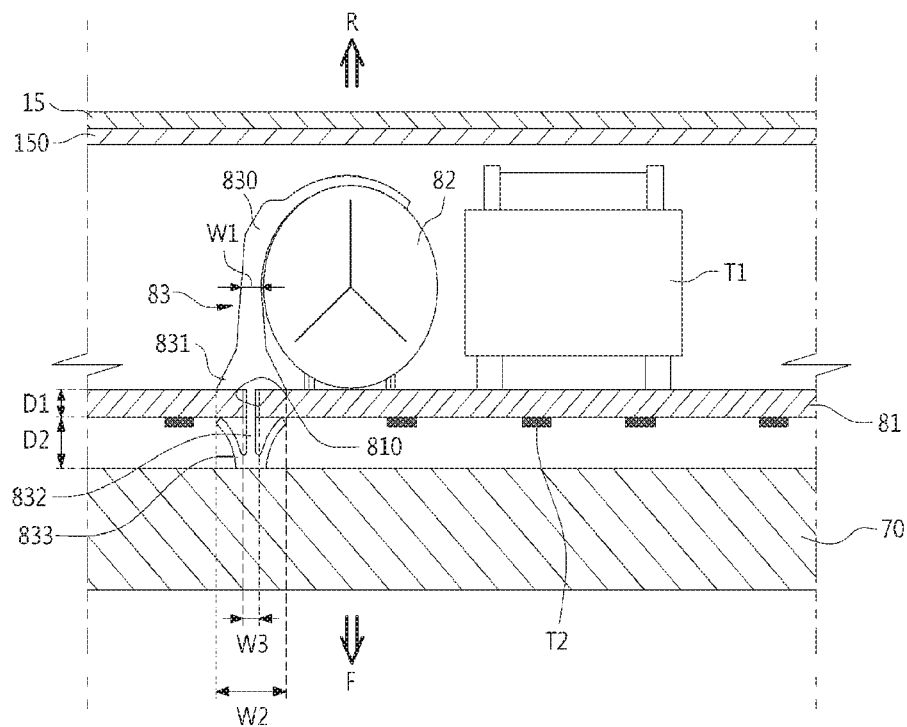
[Fig. 4a]
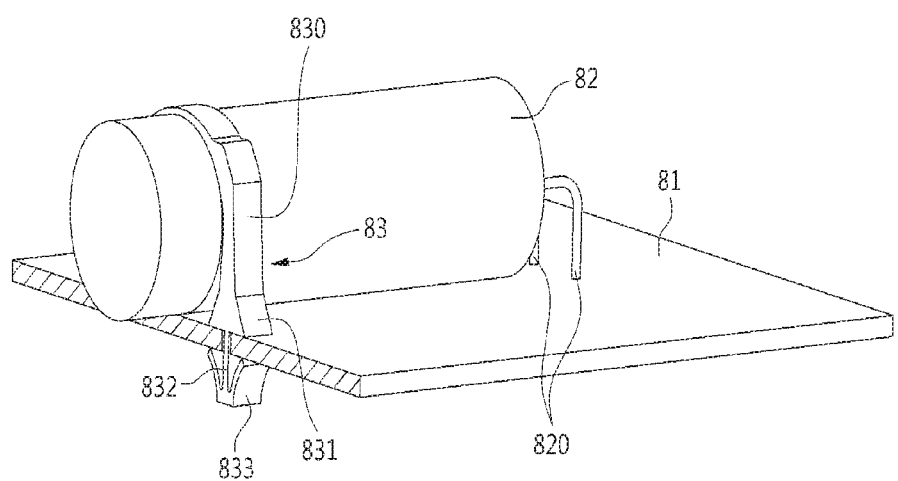

[Fig. 4b]
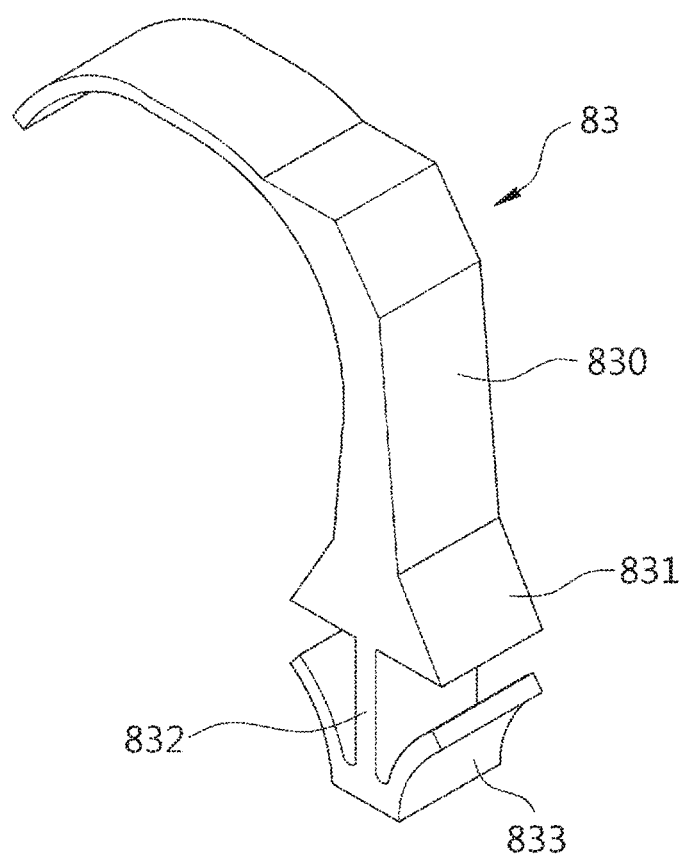

[Fig. 5]
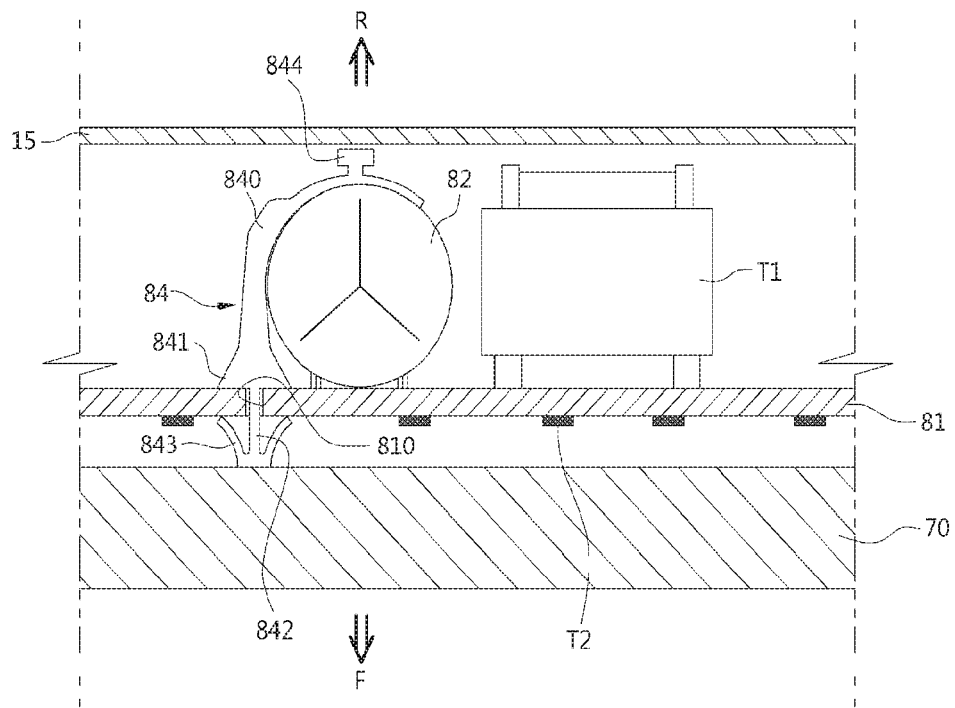
[Fig. 6]
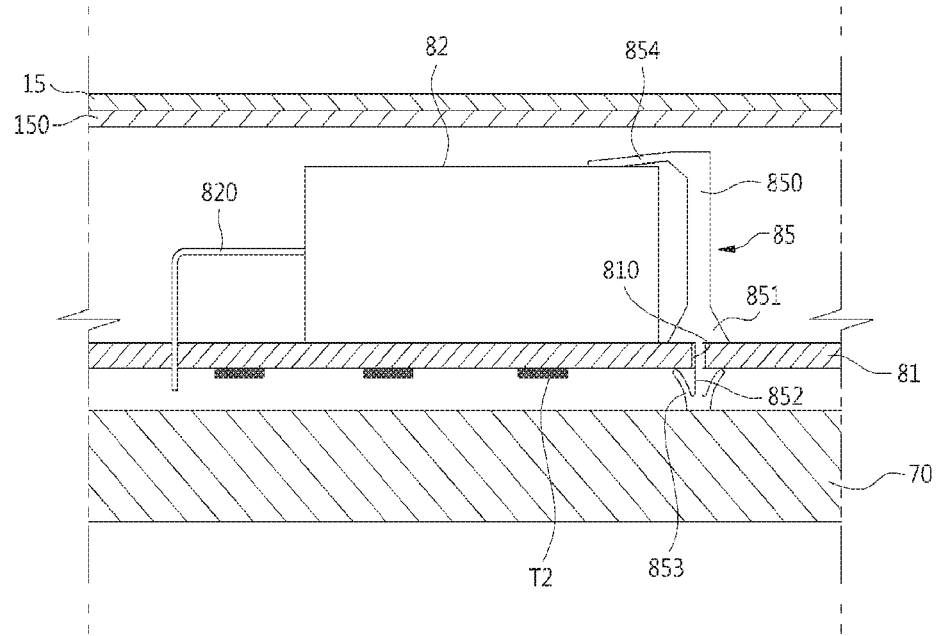

[Fig. 7]
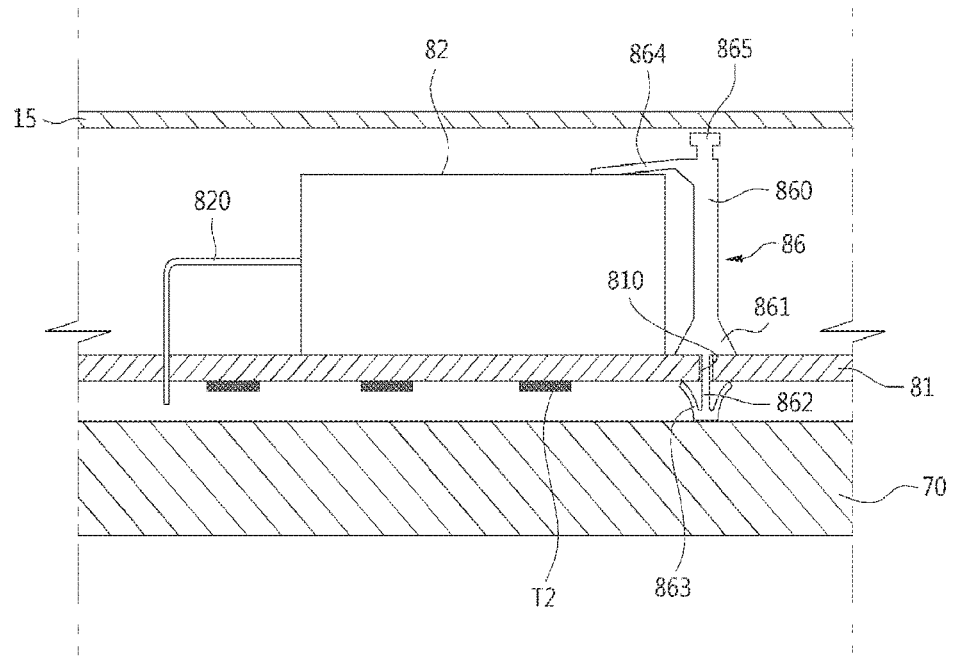
[Fig. 8]
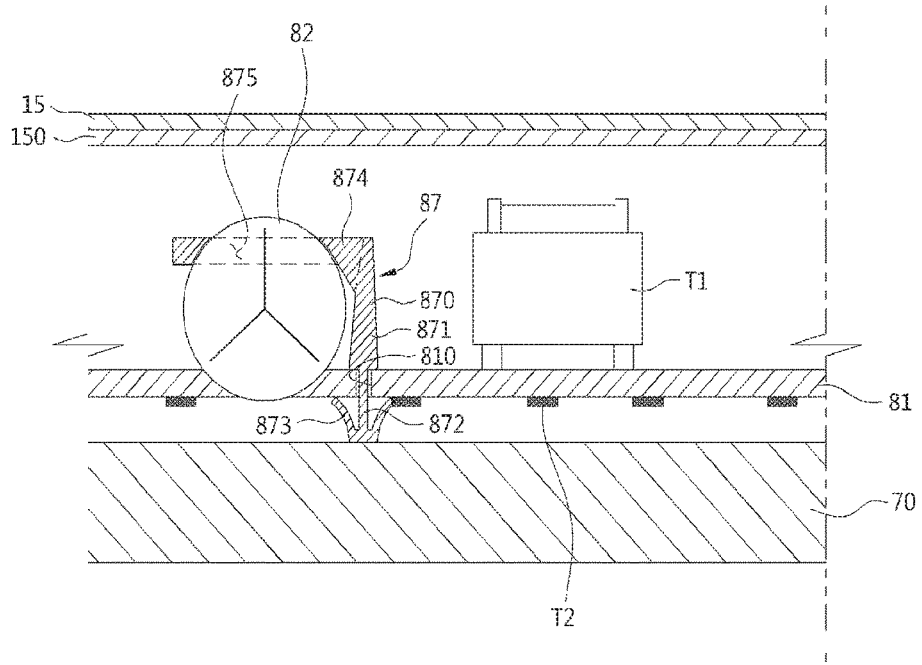

[Fig. 9]
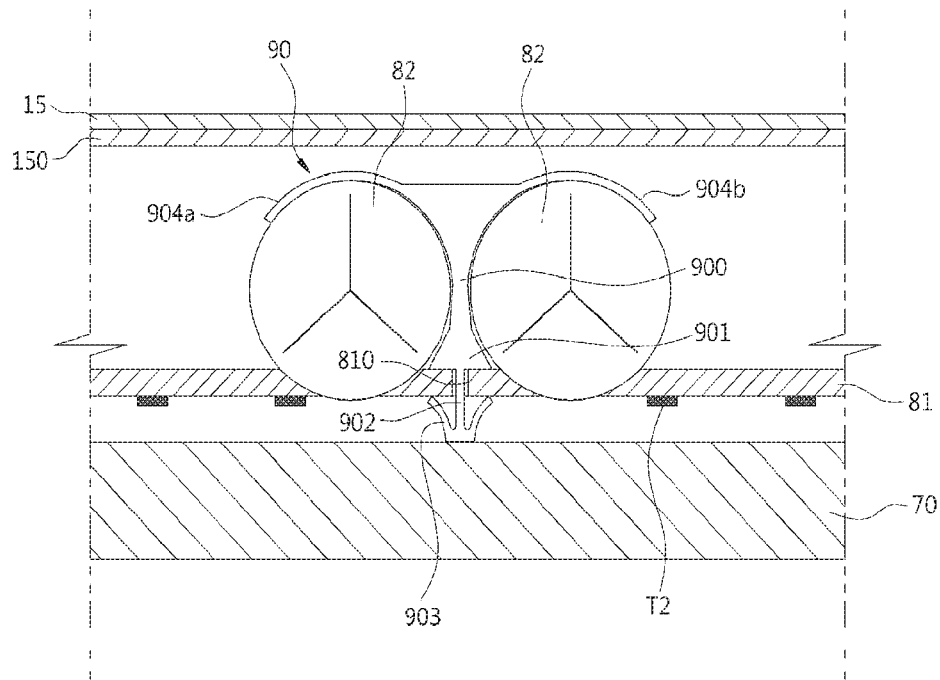
[Fig. 10]
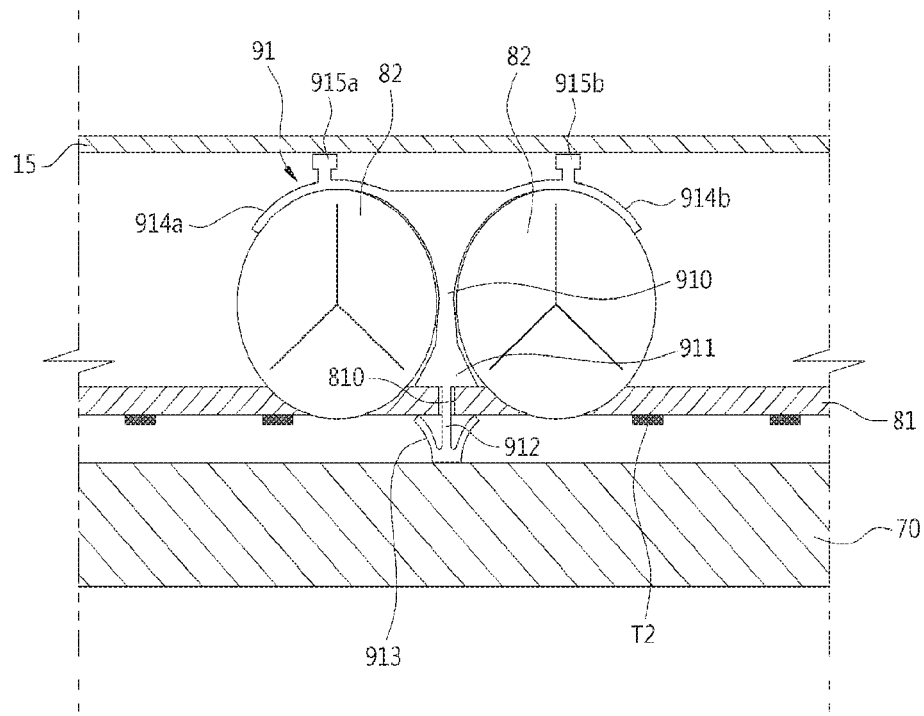

[Fig. 11]
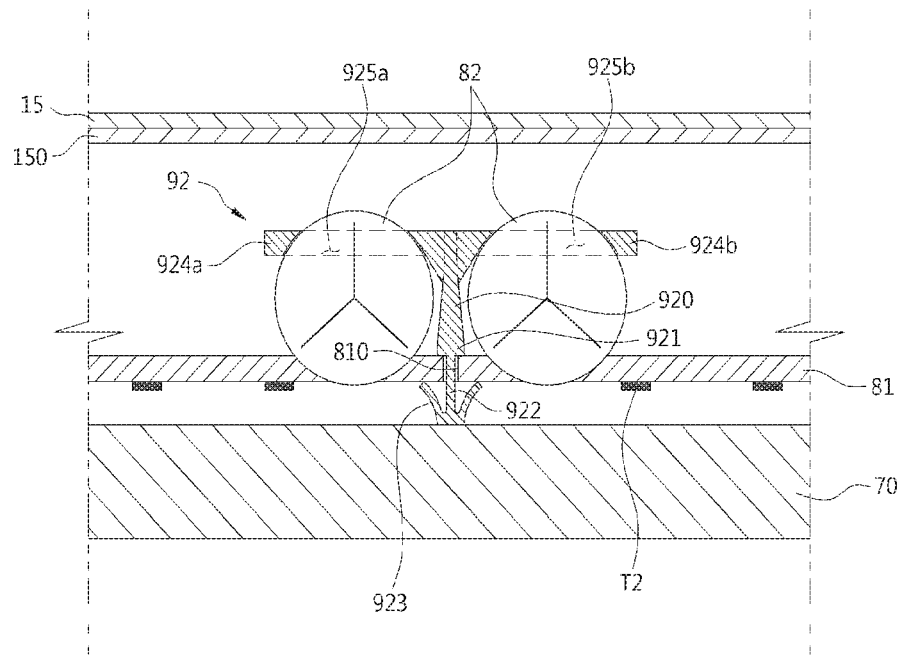
[Fig. 12]
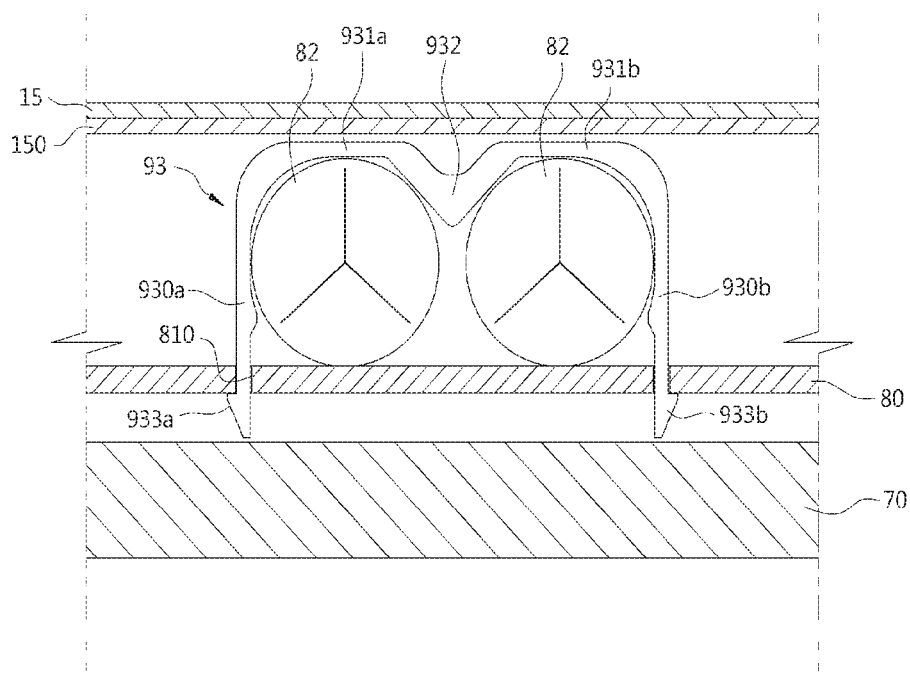

[Fig. 13]
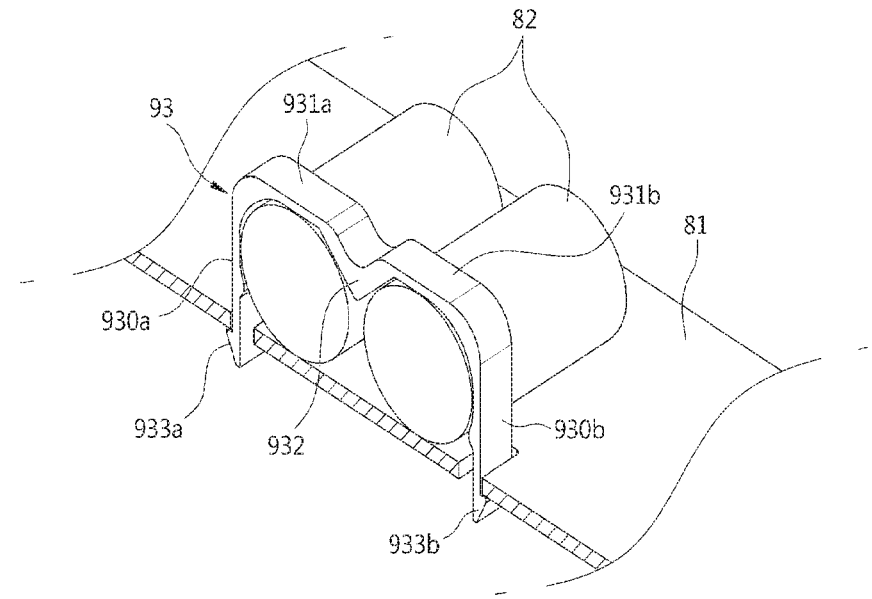
[Fig. 14]
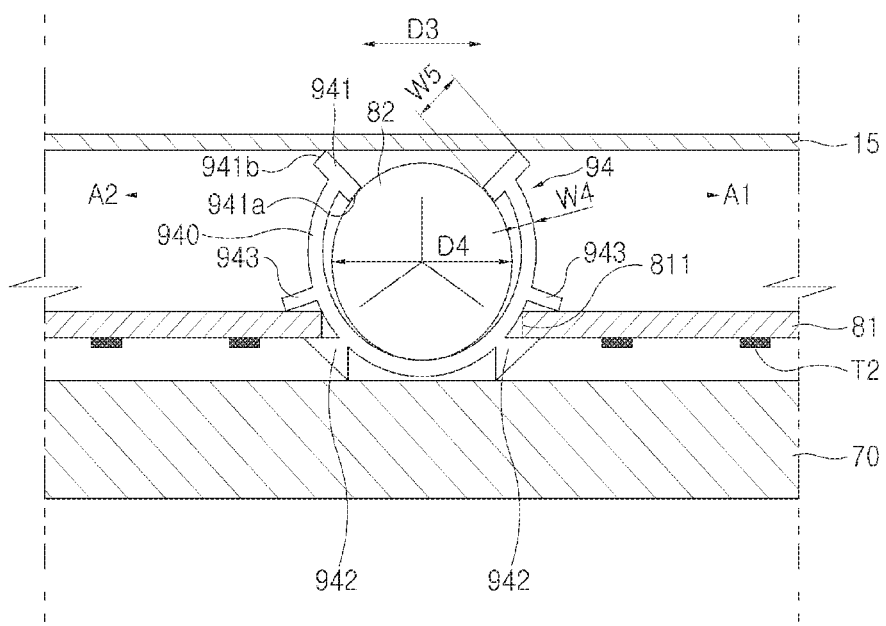

[Fig. 15]
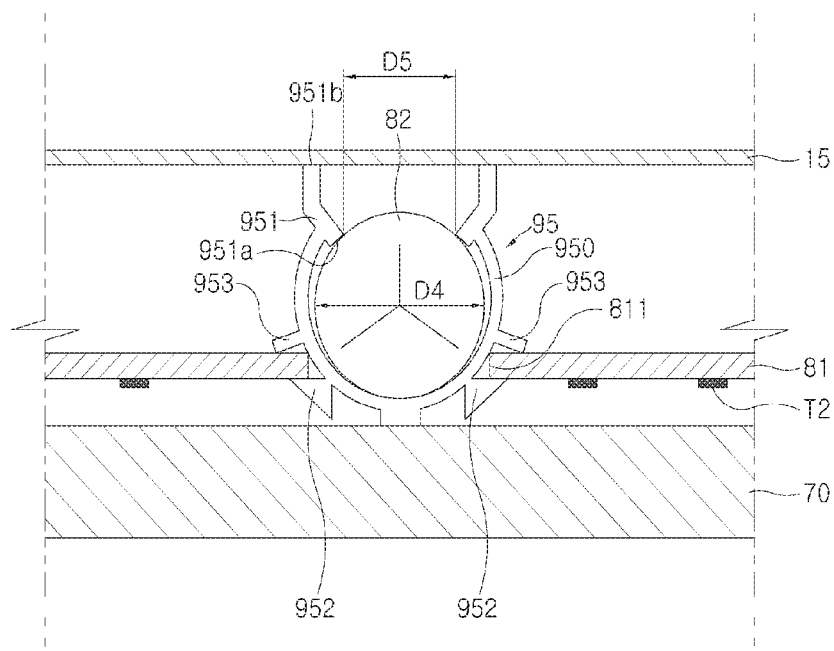

CLAMP AND DISPLAY DEVICE INCLUDING SAME

CROSS-REFERENCE TO RELATED APPLICATION

This is a National Stage Entry of International Application No. PCT/KR2015/003493 filed Apr 7, 2015, claiming priority from Korean Patent Application No. 10-2014-0041796 filed Apr 8, 2014 and Korean Patent Application No. 10-2015-0049309 filed Apr 7, 2015, the contents of all of which are incorporated herein by reference in their entirety.

TECHNICAL FIELD

The present disclosure relates to a clamp for fixing components mounted on a Printed Circuit Board (PCB), and a display device including the same.

BACKGROUND ART

A Printed Circuit Board (PCB) is fabricated by printing a circuit line pattern with a conductive material such as copper on an electrically insulating board. The PCB means a board just before electronic components are mounted thereon. In order to densely mount various kinds of electronic devices on the flat plate surface of a PCB, the positions of the individual components are settled on the PCB, and a circuit pattern for connecting the components is printed and fixed on the flat plate surface.

The PCB is widely used in various kinds of electrical and electronic equipment, such as a mobile phone, a laptop computer, a display device. etc.

A PCB assembly includes such a PCB, electronic components mounted on the PCB, and a connector for connecting the PCB to external electronic equipment. The electronic components can be mounted on both sides of the PCB.

The electronic components are fixed on the PCB without deviating from the PCB. The electronic components can be mounted on the PCB through post processing after the PCB is fabricated. Also, the electronic components can be fixed on the PCB through soldering or by an adhesive.

Since the electronic components mounted on the PCB include heat-generating members, high-voltage members, etc., the PCB is spaced by a predetermined distance from the adjacent components in the electronic equipment. The PCB can be spaced by a predetermined distance from other components in the electronic equipment by a spacing member.

DISCLOSURE

Technical Problem

An aspect of the present disclosure is to provide a clamp for fixing electronic components on a Printed Circuit Board (PCB), and enabling the PCB to be spaced from another component.

Technical Solution

In accordance with an aspect of the present disclosure, there is provided a clamp comprises a fixing part configured to surround at least one part of the outer surface of an electronic component, a connection part extending from the fixing part, and penetrating a Printed Circuit Board (PCB), an interference part provided in at least one of the fixing part or the connection part, and configured to be interfered by the PCB and a spacing part protruding from at least one of the connection part or the fixing part.

The fixing part has elasticity to press the electronic component toward the PCB.

The spacing part is integrated into the fixing part or the connection part.

A plurality of fixing parts are provided to fix a plurality of electronic components.

A support part is formed between the fixing part and the connection part.

The interference part comprises a first interference part formed at one end of the support part, and a second interference part formed at one end of the connection part.

The first interference part is interfered by one surface of the PCB, and the second interference part is interfered by the other surface of the PCB.

The second interference part is a plurality of blades extending from the end of the connection part in a direction in which the fixing part is disposed.

The second interference part is flexible such that the diameter of the end of the second interference part is able to be reduced by an external force.

The connection part is inserted into a hole formed in the PCB.

The connection part is in the shape of a polyhedron.

In the fixing part, a hole into which a part of the electronic component is able to be inserted is formed.

The connection part comprises a first connection part formed at one end of the fixing part and a second connection part formed at the other end of the fixing part.

The fixing part crosses a plurality of electronic components located between the first connection part and the second connection part.

A portion of the fixing part located between neighboring electronic components of the plurality of electronic components is bent to surround parts of the outer surfaces of the neighboring electronic components.

In accordance with an aspect of the present disclosure, there is provided a display device comprises a rear cover forming a rear outer appearance of the display device, a bottom chassis on which a backlight unit is rested and a Printed Circuit Board (PCB) assembly disposed between the rear cover and the bottom chassis, and including a plurality of electronic components and a PCB on which the plurality of electronic components are mounted, wherein the electronic components are mounted on the PCB by a clamp, the clamp comprises a pressing part disposed on one edge of the PCB and configured to press the electronic components toward the PCB, a support part configured to support the pressing part and a spacing part protruding from at least one of the pressing part or the support part, and configured to space the PCB assembly from the rear cover or the bottom chassis.

The support part comprises an interference part to be interfered by one surface or the other surface of the PCB.

A plurality of pressing parts extend from the support part.

In the pressing part, a hole into which a part of the electronic components is able to be inserted is formed.

In the PCB, a hole into which a part of the electronic components is able to be inserted is formed.

The clamp is injection-molded with a material having non-conductivity.

In accordance with an aspect of the present disclosure, there is provided a clamp of fixing an electronic component on a Printed Circuit Board (PCB), the clamp comprises a fixing part configured to press the electronic component toward the PCB, and to fix the electronic component on the PCB, a support part configured to support the fixing part and a spacing part protruding from the fixing part or the support part to space the PCB or the electronic component from another component adjacent to the PCB or the electronic component.

Advantageous Effects

According to an embodiment of the present disclosure, since the electronic components are fixed on the PCB by the clamp, post processing, such as soldering or application of an adhesive, may be not needed. Also, since the PCB can be spaced from the adjacent configurations by the clamp, the efficient layout of the PCB is possible, resulting in an improvement of productivity of the PCB.

BRIEF DESCRIPTION OF THE DRAWINGS

FIG. 1 is a perspective view showing a display device according to an embodiment of the present disclosure;

FIG. 2 is an exploded perspective view showing a display device according to an embodiment of the present disclosure;

FIG. 3 shows a part of a display device according to an embodiment of the present disclosure;

FIG. 4A shows a state in which an electronic component is fixed on a PCB by a clamp according to a first embodiment of the present disclosure;

FIG. 4B is a perspective view showing a clamp according to a second embodiment of the present disclosure;

FIG. 5 shows a state in which an electronic component is fixed on a PCB by the clamp according to the second embodiment of the present disclosure;

FIG. 6 shows a state in which an electronic component is fixed on a PCB by a clamp according to a third embodiment of the present disclosure;

FIG. 7 shows a state in which an electronic component is fixed on a PCB by a clamp according to a fourth embodiment of the present disclosure;

FIG. 8 shows a state in which an electronic component is fixed on a PCB by a clamp according to a fifth embodiment of the present disclosure;

FIG. 9 shows a state in which electronic components are fixed on a PCB by a clamp according to a sixth embodiment of the present disclosure;

FIG. 10 shows a state in which electronic components are fixed on a PCB by a clamp according to a seventh embodiment of the present disclosure;

FIG. 11 shows a state in which electronic components are fixed on a PCB by a clamp according to an eighth embodiment of the present disclosure;

FIGS. 12 and 13 show a state in which electronic components are fixed on a PCB by a clamp according to a ninth embodiment of the present disclosure;

FIG. 14 shows a state in which an electronic component is fixed on a PCB by a clamp according to a tenth embodiment of the present disclosure; and FIG. 15 shows a state in which an electronic component is fixed on a PCB by a clamp according to an eleventh embodiment of the present disclosure.

BEST MODE

Hereinafter, a clamp according to an embodiment of the present disclosure, and a display device including the same will be described in detail with reference to the accompanying drawings.

FIG. 1 is a perspective view showing a display device according to an embodiment of the present disclosure, and FIG. 2 is an exploded perspective view showing a display device according to an embodiment of the present disclosure.

Referring to FIGS. 1 and 2, a display device 1 according to an embodiment of the present disclosure may include a top chassis 10, a display panel 20, a backlight unit 60, and a bottom chassis 70. The top chassis 10 may be disposed in front of the display panel 20. The backlight unit 60 may be disposed behind the display panel 20, and spaced from the display panel 20. The bottom chassis 70 may be disposed behind the display panel 20 and the backlight unit 60.

A middle mold 40 may be further provided between the display panel 20 and the backlight unit 60. The middle mold 40 may enable the display panel 20 to be spaced from the backlight unit 60 and supported on the backlight unit 60. Behind the bottom chassis 70, a Printed Circuit Board (PCB) assembly 80 may be disposed to control driving of the display device 1. Behind the PCB assembly 80, a rear cover 15 may be disposed to form the rear appearance of the display device 1.

Behind the display panel 20, a plurality of optical sheets 30 may be disposed. Behind the optical sheets 30, a light guide plate 50 may be disposed. Behind the light guide plate 50, a reflective sheet 55 may be disposed.

The optical sheets 30 may include a protection film 31, a prism film 32, and a diffuser film 33. The protection film 31 may be disposed in front of the prism film 32 to protect the prism film 32 that is sensitive to dusts, scratches, etc.

On the front surface of the prism film 32, a trigonal prism may be formed. By the prism film 32, light diffused by the diffuser film 33 can be focused vertically on the rear surface of the display panel 20. There may be provided two prism films 32. Light passed through the prism film 32 may be irradiated vertically on the display panel 20 so that the display panel 20 can have constant brightness.

On the diffuser film 33, a coating layer may be formed in the form of beads. Light passed through the light guide plate 50 may be diffused by the diffuser film 33 and then supplied to the display panel 20.

The light guide plate 50 may enable light emitted from a plurality of Light Emitting Diodes (LEDs) 61 to be uniformly supplied onto the diffuser film 33. The light guide plate 50 may be formed of an acrylic resin such as Polymethyl methacrylate (PMMA) or polymethylstrene.

The light guide plate 50 may include an exit surface 51 and an entry surface 52. The exit surface 51 may be located behind the diffuser film 33 to face one surface of the diffuser film 33. The entry surface 52 may be one or more lateral surfaces of the light guide plate 50 so that light emitted from the light-emitting diodes 61 can be incident onto the lateral surfaces of the light guide plate 50.

The reflective sheet 55 may be disposed behind the light guide plate 50. The reflective sheet 55 may enable light exiting the lower surface of the light guide plate 50 to be directed towards the light guide plate 50. The reflective sheet 55 may be formed of a plastic material, such as polyethylene terephthalate (PET) or poly carbonate (PC).

The backlight unit 60 may include the plurality of LEDs 61 and a PCB 62. The LEDs 61 may supply light to the light guide plate 50. The LEDs 61 may be mounted on the PCB 62.

The LEDs 61 may be mounted on the PCB 62 in such a way to protrude from one surface of the PCB 62. The plurality of LEDs 61 may be arranged at regular intervals on the surface of the PCB 62. The plurality of LEDs 61 may be disposed to the left or right of the reflective sheet 55. The LEDs 61 may irradiate light in a direction that is vertical to a direction in which they protrude from the PCB 62. However, the plurality of LEDs 61 may be arranged in a different way. For example, the plurality of LEDs 61 may be arranged in front of the reflective sheet 55 so as to irradiate light toward the light guide plate 50.

The PCB 62 may be disposed behind the reflective sheet 55. The PCB 62 may be fixed on the bottom chassis 70 through a coupling member such as a screw or adhesive means such as a double-sided tape. The rear surface of the PCB 62 that is opposite to the surface on which the plurality of LEDs 61 are mounted may be fixed on the bottom surface 72 of the bottom chassis 70.

The LEDs 61 may be a plurality of LEDs to emit white light, or a combination of a plurality of LEDs to emit red light, green light, and blue light.

The display panel 20 may include a first board 211 on which a plurality of Thin Film Transistors (TFTs) and a plurality of pixel electrodes are mounted, and a second board 210 which is disposed on one surface of the first board 211 and on which a color filter and a driving source are mounted. A liquid crystal layer 212 may be interposed between the first board 211 and the second board 210. A polarizing sheet 22 or 23 may be attached on the lower surface of the first board 211 or the upper surface of the second board 210. A module into which the first board 211, the second board 210, and the liquid crystal layer 212 are combined is referred to as a liquid crystal display (LCD) module 21.

Along one lateral side of the first board 211, a driver 25 for applying a driving signal may be provided. The driver 25 may include a Flexible Printed Circuit (FPC) board 26, a driving chip 27, and a circuit board 28. The driving chip 27 may be mounted on one edge of the FPC board 26. The circuit board 28 may be connected to the other edge of the FPC board 26.

The FPC board 26 may be provided in the form of a Chip On Film (COF) in which a chip device is mounted on a base film. Also, the FPC board 26 may be provided in the form of Chip On Glass (COG) or Tape Carrier Package (TCP) based on Tape Automated Bonding (TAP) technology.

On the second board 210, a black matrix 213 may be formed, and a plurality of color filters (not shown) may be formed between the black matrix 213. For example, the black matrix 213 may be formed of an organic material including chrome oxide or a black pigment. The color filters may be arranged at regular intervals in such a way that three sub layers (not shown) having different colors are repeatedly arranged.

The display panel 20 may form a screen by adjusting the alignment of the liquid crystal layer 212. The display panel 20, which is a non-emissive device, may receive light from the backlight unit 60 to display images.

The top chassis 10 may include a bezel 11 and a top side part 12. The bezel 11 may surround the front edges of the display panel 20. The top side part 12 may be formed by bending the edges of the bezel 11 backward. At least one part of the top side part 12 may contact the bottom chassis 70. For example, at least one portion of the top side part 12 may cover the outer lateral surfaces of the bottom chassis 70.

The top chassis 10 may include an opening 13 to expose the display panel 20. Through the opening 13, a valid display area on which a screen is actually displayed in the display panel 20 may be exposed in a front direction.

The bottom chassis 70 may include a bottom side part 71 and a bottom 72. The bottom side part 71 may protrude in the front direction along the edges of the bottom 72. The backlight unit 60 may be rested on the bottom 72. Behind the rear surface of the bottom 72 of the bottom chassis 70, a heat dissipation sheet 80 may be disposed.

The middle mold 40 may include a first support part 40a, a second support part 40b, and an extension part 40c. The first support part 40a and the second support part 40b may extend toward the inside of the middle mold 40. The second support part 40b may extend from the first support part 40a toward the inside of the middle mold 40 in such a way to be stepped backward from the first support part 40a. The extension part 40c may extend backward from the middle mold 40. A part of the display panel 20 may be supported by the first support part 40a. A part of the optical sheets 30 may be supported by the second support part 40b. The outer lateral surfaces of the extension part 40c may contact the inner lateral surfaces of the bottom chassis 70.

The LEDs 61 may emit light and heat simultaneously. The PCB 62 may supply a driving signal to the LEDs 61, while transferring heat generated by the LEDs 61 to the outside. That is, heat generated by the LEDs 61 may be transferred to the bottom chassis 70 through the PCB 62. In order to enhance heat transfer efficiency, the PCB 62 may be formed of a metal having high heat conductivity. For example, the PCB 62 may be formed of a metal material including aluminum, copper, etc.

Behind the bottom chassis 70, a PCB assembly 80 may be disposed. Behind the PCB assembly 80, the rear cover 15 may be disposed. The PCB assembly 80 may include a PCB 81 and a plurality of electronic components 82 installed on the PCB 81. The electronic components 82 may be installed on the front or rear surface of the PCB 81. The plurality of electronic components 82 may be mounted on the PCB 81 or fixed on the PCB 81 by a clamp 83 (see FIG. 3).

Hereinafter, a configuration in which the electronic components 82 are fixed on the PCB 81 by the clamp 83 will be described.

FIG. 3 shows a part of a display device according to an embodiment of the present disclosure, FIG. 4A shows a state in which an electronic component is fixed on a PCB by a clamp according to a first embodiment of the present disclosure, and FIG. 4B is a perspective view showing a clamp according to a second embodiment of the present disclosure.

Referring to FIGS. 3 and 4B, the PCB assembly 80 of the display device 1 according to an embodiment of the present disclosure may include the PCB 81 and the electronic components 82 installed on the PCB 81. The electronic components 82 may be fixed on the PCB 81 by the clamp 83.

On the PCB 81, electronic components 82, such as a converter component for converting an alternating-current voltage into a direct-current voltage, a condenser for charging a constant voltage using the converted direct-current voltage, Field Effect Transistors (FETs) T2 for amplifying a voltage, various kinds of switches, etc. may be installed.

Bulky components, such as the condenser 82, a heating component T1, etc., may be installed on the rear surface R of the PCB 81. That is, the condenser 82, the heating component T1, etc. may be positioned between the rear cover 15 and the PCB 81. Components that are smaller than the condenser 82, the heating component T1, etc., for example, components, such as various kinds of switches or FETs T2, may be arranged on the front surface F or the rear surface R of the PCB 81.

An alternating-current voltage may be supplied from an external power supply. The alternating-current voltage supplied to the display device 1 may be converted into a direct-current voltage by the converter component. The direct-current voltage may be stored in the condenser 82, and amplified and used by the FETs T2 as necessary. The converter component T1 and the FETs T2 may generate high heat. Accordingly, the PCB assembly 80 including the converter component T1 and the FETs T2 may need to be spaced by a predetermined distance from the bottom chassis 70 and the rear cover 15 so that the temperatures of the bottom chassis 15 and the rear cover 15 adjacent to the PCB assembly 80 do not rise.

The condenser 82 may be in the shape of a cylinder, and a pair of leads 820 may be connected to one end of the condenser 82. The leads 820 may penetrate the PCB 81 to connect to the FETs T2 located on the front surface F of the PCB 81 or components located on the front surface F of the PCB 81. In order to prevent the leads 820 protruding from the front surface F of the PCB 81 from being interfered by the bottom chassis 70, the PCB 81 may need to be spaced by a predetermined distance from the bottom chassis 70.

The condenser 82 may be in the shape of a cylinder, and may be installed on the PCB 81 by separate fixing means. Typically, a method of locating the condenser 82 on one surface of the PCB 81 and then bonding the condenser 82 on the PCB 81 using silicon-based sealant has been used.

However, when the condenser 82 is bonded on the PCB 81 using sealant, a task of applying sealant on an area where the condenser 82 is to be bonded is burden to a worker, and also, since the condenser 82 is not fixed until the sealant is dried, a time for fixing the condenser 82 needs to be ensured. Furthermore, the PCB 81 may become dirty due to the applied sealant.

Also, in the typical method, the PCB 81 needs to include a spacing member so that the PCB 81 can be spaced from the bottom chassis 70 or the rear cover 15, resulting in deteriorating efficiency in configuration of the PCB 81.

The clamp 83 according to an embodiment of the present disclosure may function as a fixing member for fixing the condenser 82, while functioning as a spacing member for spacing the PCB 81 from the bottom chassis 70.

The clamp 83 may be made of a lightweight material having non-conductivity. For example, the clamp 83 may be injection-molded with a plastic material.

The clamp 83 may include a fixing part 830 surrounding a part of the outer surface of the condenser 82, a first interference part 831 formed in one end of the fixing part 830, a connection part 832 extending from the first interference part 831, and a second interference part 833 formed in the end of the connection part 832.

In the PCB 81, a hole 810 into which the connection part 832 is inserted may be formed. The fixing part 830 and the first interference part 831 may be disposed on the rear surface of the PCB 81, and the second interference part 833 may be disposed on the front surface of the PCB 81.

The fixing part 830 may surround a part of the outer surface of the condenser 82 from one lateral side of the condenser 82. The fixing part 830 may have elasticity to press the condenser 82 toward the PCB 81. If a direction in which the leads 820 protrude is referred to as a front direction of the condenser 82, and a direction that is opposite to the front direction is referred to as a rear direction, the fixing part 830 may surround a part of the outer surface of the condenser 82 from one lateral side of the condenser 82.

The first interference part 831 may be integrated into the fixing part 830. The width W2 of the end of the first interference part 831 may be greater than the width W1 of the fixing part 830. Also, the width W2 of the first interference part 831 may be greater than the width W3 of the hole 810 formed in the PCB 81. Since the width W2 of the first interference part 831 is greater than the width W3 of the hole 810 formed in the PCB 81, the connection part 832 can be fixed without moving along the hole 810 formed in the PCB 81.

The connection part 832 may penetrate the PCB 81, and further extend by a predetermined length D2 in the front direction of the PCB 81. The length of the connection part 832 may be longer than the thickness D1 of the PCB 81 so that the connection part 832 can further extend by the predetermined length D2 in the front direction of the PCB 81. Thereby, the front surface of the PCB 81 can be spaced by the predetermined length D2 from the bottom chassis 70.

The connection part 832 may have a section of a polygon shape. That is, the outer appearance of the connection part 832 may be in the shape of a polyhedron having edges. For example, the connection part 832 may be in the shape of a rectangular column. The hole 810 of the PCB 81, through which the connection part 832 passes, may be formed to correspond to the outer surfaces of the connection part 832. As such, since the outer surfaces of the connection part 832 are angled, the connection part 832 can be prevented from rotating in the hole 810 when the clamp 83 is installed on the PCB 81. Thereby, the condenser 82 can be stably fixed by the clamp 83.

The second interference part 833 may be formed at the end of the connection part 832. The second interference part 833 may be a plurality of blades extending from the end of the connection part 832 in the rear direction in which the fixing part 830 and the first interference part 831 are disposed. The second interference part 833 may become more distant from the outer surfaces of the connection part 832 in the rear direction in which the fixing part 830 and the first interference part 831 are located than in the front direction in which the end of the connection part 832 is located. When no external force is applied, the diameter of the end of the second interference part 833 may be greater than the diameter of the hole 810 formed in the PCB 81. Accordingly, the connection part 832 can be fixed without moving along the hole 810.

As described above, the clamp 83 may be fixed in the rear direction by the first interference part 831, and in the front direction by the second interference part 833. Accordingly, the fixing part 830 can fix the condenser 82 stably so that the condenser 82 does not move.

Due to the connection part 832 further extending by the predetermined length D2 from the front surface of the PCB 81, the PCB 81 may be spaced from the bottom chassis 70. Since the PCB 81 is spaced from the bottom chassis 70, it is possible to prevent the temperature of the bottom chassis 70 from rising due to heat-generating components mounted on the PCB 81.

On the inner surface of the rear cover 15, a heat dissipation member 150 may be disposed. Thereby, it is possible to prevent the temperature of the rear cover 15 from rising due to heat generated by the heat-generating components mounted on the PCB 81.

When a user fixes the condenser 82 on the PCB 81 using the clamp 83, the user may apply an external force to the second interference part 833 so that the second interference part 833 closely contacts the connection part 832, and then pass the second interference part 833 through the hole 810 formed in the PCB 833. If the external force is removed, the clamp 83 may be fixed by the second interference part 833 in the front direction. Also, the clamp 83 may be fixed by the first interference part 831 in the rear direction. If the clamp 83 is fixed on the PCB 81, the user may apply an external force for lifting the fixing part 830 to put the condenser 82 in the fixing part 830. Thereby, the fixing part 830 may surround a part of the outer surface of the condenser 82 so that the condenser 82 can be fixed on the PCB 81.

As another example, the second interference part 833 may be provided as a component that is separated from the fixing part 830, the first interference part 831, and the connection part 832. If the connection part 832 passes through the hole 810 formed in the PCB 81, the second interference part 833 may be coupled with the end of the connection part 832 in the front direction of the PCB 81. Thereby, the clamp 83 can be fixed on the PCB 81.

As another example, the connection part 832 and the second interference part 833 may be provided as components that are separated from the fixing part 830 and the first interference part 831. After the connection part 832 passes through the hole 810 formed in the PCB 81 in the front direction of the PCB 81, the first interference part 831 may be coupled with the connection part 832 in the rear direction of the PCB 81. Thereby, the clamp 83 can be fixed on the PCB 81.

However, a method of installing the clamp 83 on the PCB 81 is not limited to the above-described method. The above-described method of installing the clamp 83 on the PCB 81 can be applied in the similar manner to embodiments which will be described below.

FIG. 5 shows a state in which an electronic component is fixed on a PCB by a clamp according to a second embodiment of the present disclosure.

Referring to FIG. 5, in a clamp 84 according to a second embodiment of the present disclosure, a spacing part 844 may be provided in a fixing part 840. The spacing part 844 may protrude from a part of the fixing part 840. Due to the spacing part 844, the PCB assembly 80 may be spaced from the rear cover 15.

The clamp 84 according to the second embodiment of the present disclosure is different from the clamp 83 according to the first embodiment of the present disclosure in that the spacing part 844 protrudes from the fixing part 840. Also, details about the fixing part 830, the first interference part 831, the connection part 832, and the second interference part 833 of the clamp 83 according to the first embodiment of the present disclosure can be applied to the fixing part 840, a first interference part 841, a connection part 842, and a second interference part 843 of the clamp 84 according to the second embodiment of the present disclosure.

That is, the fixing part 840 may surround a part of the outer surface of the condenser 82 from one lateral side of the condenser 82. Also, the fixing part 840 may have elasticity to press the condenser 82 toward the PCB 81 and fix the condenser 82 on the PCB 81. The fixing part 840 may include the first interference part 841, the connection part 842 may extend from the first interference part 841 to pass through the hole 810 formed in the PCB 81, and the second interference part 843 may be formed in one end of the connection part 842. Due to the first interference part 841 and the second interference part 843, the clamp 84 can be fixed on the PCB 81. The diameters of the first interference part 841 and the second interference part 843 may be greater than the diameter of the hole 810 through which the connection part 832 passes. The PCB 81 may be spaced by a predetermined distance from the bottom chassis 70 by the connection part 842 further extending by the predetermined distance from the front surface of the PCB 81.

Due to the spacing part 844, the condenser 82 mounted on the PCB 81 may be spaced by a predetermined distance from the rear cover 15. The spacing part 844 may protrude with an appropriate length so that electronic components mounted on the PCB 81 can be spaced by a predetermined distance from the rear cover 15. A heat dissipation member may be disposed on the rear cover 15 as necessary. However, no heat dissipation member may be provided on the rear cover 15 since the electronic components mounted on the PCB 81 are spaced by the predetermined distance from the rear cover 15 due to the spacing part 844.

FIG. 6 shows a state in which an electronic component is fixed on a PCB by a clamp according to a third embodiment of the present disclosure.

Referring to FIG. 6, a clamp 85 according to the third embodiment of the present disclosure may be disposed behind the condenser 82 to press the outer surface of the condenser 82. The leads 820 of the condenser 82 may be disposed in front of the condenser 82.

The clamp 85 may include a support part 850 extending in the rear direction of the PCB 81, a first interference part 851 formed in one end of the support part 850, a connection part 852 extending from the first interference part 851, and a second interference part 853 formed in one end of the connection part 851.

The connection part 852 may penetrate the PCB 81, and the diameters of the first interference part 851 and the second interference part 853 may be greater than the diameter of the hole 810 formed in the PCB 81. The clamp 85 may be fixed on the PCB 81 by the first interference part 851 and the second interference part 853. The PCB 81 may be spaced by a predetermined distance from the bottom chassis 70 by the connection part 852 further extending by a predetermined distance from the front surface. Meanwhile, the connection part 852 may be in the shape of an angled column to prevent the connection part 852 from rotating in the hole 810 formed in the PCB 81.

A pressing part 854 may extend from the other end of the support part 850. The pressing part 854 may have elasticity to press the outer surface of the condenser 82. Due to the pressing part 854, the condenser 82 may be pressed toward the PCB 81 and fixed on the PCB 81. Since the condenser 82 is fixed by the pressing part 854, the pressing part 854 can be also referred to as a fixing part.

The clamp 85 according to the third embodiment of the present disclosure is different from the clamp 83 according to the first embodiment of the present disclosure in that the clamp 85 includes the support part 850 and the pressing part 854. Also, details about the connection part 832, the first interference part 831, and the second interference part 833 of the clamp 83 according to the first embodiment of the present disclosure may be applied to the connection part 852, the first interference part 851, and the second interference part 853 of the clamp 85 according to the third embodiment of the present disclosure.

If the PCB assembly 80 including the clamp 85 according to the third embodiment of the present disclosure is included in the display device 1, a heat dissipation member may be disposed on the rear cover 15. Accordingly, heat generated from components mounted on the PCB 81 may be transferred to the rear cover 15 via the heat dissipation member, thereby preventing the temperature of the rear cover 15 from rising.

FIG. 7 shows a state in which an electronic component is fixed on a PCB by a clamp according to a fourth embodiment of the present disclosure.

Referring to FIG. 7, in a clamp 86 according to the fourth embodiment of the present disclosure, a spacing part 865 may be provided in a support part 860. The spacing part 865 may protrude from one end of the support part 860. Due to the spacing part 865, the PCB assembly 80 may be spaced by a predetermined distance from the rear cover 15.

The clamp 86 according to the fourth embodiment of the present disclosure is different from the clamp 85 according to the third embodiment of the present disclosure in that the spacing part 865 protrudes from the support part 860. Also, details about the support part 850, the first interference part 851, the connection part 852, the second interference part 853, and the pressing part 854 of the clamp 85 according to the third embodiment of the present disclosure may be applied to the support part 860, a first interference part 861, a connection part 862, a second interference part 863, and the pressing part 864 of the clamp 86 according to the fourth embodiment of the present disclosure.

That is, the clamp 86 may include the support part 860 extending in the rear direction of the PCB 81, the first interference part 861 formed in one end of the support part 860, the connection part 862 extending from the first interference part 861, and the second interference part 863 provided in one end of the connection part 862.

The connection part 862 may penetrate the PCB 81, and the diameters of the first interference part 861 and the second interference part 863 may be greater than the diameter of the hole 810 formed in the PCB 81. The clamp 86 may be fixed on the PCB 81 by the first interference part 861 and the second interference part 863. The PCB 81 may be spaced by a predetermined distance from the bottom chassis 70 by the connection part 862 extending by the predetermined distance from the front surface of the PCB 81. Meanwhile, the connection part 862 may be in the shape of an angled column so as to be prevented from rotating in the hole 810 formed in the PCB 81.

The pressing part 864 may extend from the other end of the support part 860. The pressing part 864 may have elasticity to press the outer surface of the condenser 82. Due to the pressing part 864, the condenser 82 may be pressed toward the PCB 81 and fixed on the PCB 81.

An insulating member may be provided in the rear cover 15, as necessary. However, no insulating member may be provided in the rear cover 15 since the condenser 82 is spaced by the predetermined distance from the rear cover 15 due to the spacing part 855.

FIG. 8 shows a state in which an electronic component is fixed on a PCB by a clamp according to a fifth embodiment of the present disclosure.

Referring to FIG. 8, a clamp 87 according to the fifth embodiment of the present disclosure may include a support part 870 located to one lateral side of the condenser 82, a first interference part 871, a connection part 872, a second interference part 873, and a pressing part 874 extending from the support part 870 to press the condenser 82. The clamp 87 may be located to one lateral side of the condenser 82 to press the outer surface of the condenser 82 and fix the condenser 82.

The pressing part 874 may be configured so that a part of the condenser 82 can protrude outward from the pressing part 874. For example, the pressing part 874 may include a hole 875 into which a part of the condenser 82 can be inserted. The part of the condenser 82 may pass through the hole 875 to be exposed outward from the pressing part 874, that is, in a direction in which the rear cover 15 is located. The pressing part 874 may have elasticity to press the condenser 82 toward the PCB 81.

In the PCB 81, a hole or groove into which a part of the condenser 82 can be inserted. A part of the condenser 82 may be inserted into the hole or groove formed in the PCB 81, and the opposite part of the condenser 82 may pass through the hole 875 formed in the pressing part 874, thereby minimizing the lengths to which the condenser 82 and the clamp 87 protrude from the PCB 81. Accordingly, a distance from the rear surface of the PCB 81 to the rear cover 15 can be minimized.

Details about the first interference part 831, the connection part 832, and the second interference part 833 of the clamp 83 according to the first embodiment of the present disclosure can be applied to the first interference part 871, the connection part 872, and the second interference part 873 of the clamp 87 according to the fifth embodiment of the present disclosure.

The above-described configuration in which a part of the condenser 82 is inserted into the hole or groove formed in the PCB 81, and the opposite part of the condenser 82 passes through the hole 875 formed in the pressing part 874 can be applied to the super-slim model of the display device 1. On the inner surface of the rear cover 15, a heat dissipation member may be provided. In one end of the support part 870, a spacing part may be formed.

FIG. 9 shows a state in which electronic components are fixed on a PCB by a clamp according to a sixth embodiment of the present disclosure.

Referring to FIG. 9, a clamp 90 according to the sixth embodiment of the present disclosure may fix a plurality of condensers 82. For example, the clamp 90 may fix two condensers 82, as shown in FIG. 9. The clamp 90 may include a support part 900, first and second pressing parts 904A and 904B extending from one end of the support part 900, a first interference part 901 formed in the other end of the support part 900, a connection part 902 connected to the first interference part 901 and penetrating the PCB 81, and a second interference part 903 formed in one end of the connection part 902.

The pressing parts 904A and 904B may include the first pressing part 904*a* extending to the left of the support part 900 and the second pressing part 904*b* extending to the right of the support part 900. The first and second pressing parts 904*a* and 904*b* may surround a part of the outer surfaces of the condensers 82. Each of the first and second pressing parts 904*a* and 904*b* may include a hole through which a part of the corresponding condenser 82 can protrude outward from the pressing part 904*a* or 904*b*, like the pressing part 874 according to the fifth embodiment of the present disclosure. The condensers 82 may be pressed toward the PCB 81 by the first and second pressing parts 904*a* and 904*b*, and fixed on the PCB 81.

In the PCB 81, a groove or a hole into which a part of the condenser 2 can be inserted may be formed. In this case, the length of the condenser 82 or the clamp 90 protruding from the PCB 81 can be minimized so that the display device 1 can be slimmed.

Details about the first interference part 831, the connection part 832, and the second interference part 833 of the clamp 83 according to the first embodiment of the present disclosure can be applied to the first interference part 901, the connection part 902, and the second interference part 903 of the clamp 90 according to the sixth embodiment of the present disclosure. If the plurality of condensers 82 are fixed by the clamp 90 according to the sixth embodiment of the present disclosure, the PCB 81 can be spaced by a predetermined distance from the bottom chassis 70 by the connection part 902 further protruding in the front direction by a predetermined distance from the PCB 81. On the inner surface of the rear cover 15, a heat dissipation member may be disposed.

FIG. 10 shows a state in which electronic components are fixed on a PCB by a clamp according to a seventh embodiment of the present disclosure.

Referring to FIG. 10, a clamp 91 according to the seventh embodiment of the present disclosure may include spacing parts 915a and 915b. The configuration of the clamp 91 according to the seventh embodiment of the present disclosure is similar to the configuration of the clamp 90 according to the sixth embodiment of the present disclosure except that the clamp 91 includes the spacing part 915a and 915b.

The spacing parts 915a and 915b may include a first spacing part 915a formed in a part of a first pressing part 914a, and a second spacing part 915b formed in a part of a second pressing part 914b. Due to the first spacing part 915a and the second spacing part 915b, the PCB assembly 80 can be spaced by a predetermined distance from the rear cover 15. The front surface of the PCB 81 may be spaced by a predetermined distance from the bottom chassis 70 by a connection part 912 protruding in the front direction of the PCB 81.

The clamp 91 may be fixed on the PCB 81 by a first interference part 911 and a second interference part 913. The connection part 912 may be in the shape of an angled column, and the hole 810 of the PCB 81 may be formed to correspond to the outer surfaces of the connection part 912 so as to prevent the connection part 912 from rotating in the hole 810.

FIG. 11 shows a state in which electronic components are fixed on a PCB by a clamp according to an eighth embodiment of the present disclosure.

Referring to FIG. 11, a clamp 92 according to the eighth embodiment of the present disclosure may fix a plurality of condensers 82. For example, the clamp 92 may include pressing parts 924a and 924b extending from a support part 920 and having holes 925a and 925b into which parts of the condensers 82 can be inserted. The pressing parts 924a and 924b may include a first pressing part 924a extending to the left of the support part 920, and a second pressing part 924b extending to the right of the support part 920. In the first pressing part 924a, a first hole 925a may be formed, and in the second pressing part 924b, a second hole 925b may be formed.

Between the first pressing part 924a and the rear surface of the PCB 81, the condenser 82 may be positioned, and the first pressing part 924a may press the condenser 82 toward the PCB 81 so as to fix the condenser 82. A part of the condenser 82 may be inserted into the first hole 925a formed in the first pressing part 924a. Like the first pressing part 924a, the second pressing part 924b may also press the condenser 82 toward the PCB 81. The part of the condenser 82 fixed by the second pressing part 924b may be inserted into the second hole 925b formed in the second pressing part 924b. In the PCB 81, grooves or holes into which the parts of the condensers 82 can be inserted may be formed.

Details about the first interference part 831, the connection part 832, and the second interference part 833 according to the first embodiment of the present disclosure can be applied to the first interference part 921, the connection part 922, and the second interference part 923. In the PCB assembly 80, the PCB 81 may be spaced by a predetermined distance from the bottom chassis 70 by the connection part 922 protruding by a predetermined distance from the front surface of the PCB 81, and a heat dissipation member may be disposed on the inner surface of the rear cover 15.

FIGS. 12 and 13 show a state in which electronic components are fixed on a PCB by a clamp according to a ninth embodiment of the present disclosure.

Referring to FIGS. 12 and 13, in a clamp 93 according to the ninth embodiment of the present disclosure, a plurality of condensers 82 may be positioned and fixed in the inside of the clamp 93. The plurality of condensers 82 may be arranged in the left-right direction, and fixed by the clamp 92.

The clamp 92 may include support parts 930a and 930b, connection parts 931a and 931b, and fixing parts 933a and 933b. The support parts 930a and 930b may include a first support part 930a disposed to one lateral side of a condenser which is the leftmost/rightmost one of the plurality of condensers 82, and a second support part 930b disposed to one lateral side of another condenser 82 which is the rightmost/leftmost one of the plurality of condensers 82. The first support part 930a and the second support part 930b may be connected to each other by the connection parts 931a and 931b. The connection parts 931a and 931b may extend to cross the plurality of condensers 82 arranged in the left-right direction. A bent part 932 may be disposed between the neighboring condensers 82. The bent part 932 may be formed by bending the connection parts 931a and 931b. The bent part 932 may be bent in such a way to surround a part of the outer surfaces of the condensers 82. The condensers 82 may be pressed toward the PCB 81 by the bent part 932, and fixed on the PCB 81.

The support parts 930a and 930b may pass through the holes 180 formed in the PCB 81. At the ends of the support parts 930a and 930b, catching protrusions 933a and 933b may be formed. The catching protrusions 933a and 933b may be interfered by the PCB 81 so that the clamp 93 can be fixed on the PCB 81. The catching protrusions 933a and 933b may protrude by a predetermined length in the front direction of the PCB 81 so as to space the PCB 81 by a predetermined distance from the bottom chassis 70. The catching protrusions 933a and 933b may be also named "interference parts".

In FIGS. 12 and 13, a structure in which two condensers 82 are fixed by the clamp 93 is shown, however, the number of condensers 82 that can be fixed by the clamp 93 is not limited to the above description and the number of condensers shown in FIGS. 12 and 13.

Likewise, in the case of the clamps shown in FIGS. 9 to 11, the number of condensers that can be fixed by each clamp is also not limited to the above description referring to FIGS. 9 to 11 and the number of condensers shown in FIGS. 9 to 11.

FIG. 14 shows a state in which an electronic component is fixed on a PCB by a clamp according to a tenth embodiment of the present disclosure.

Referring to FIG. 14, a clamp 94 according to the tenth embodiment of the present disclosure may surround at least one part of a condenser 82 adjacent to the PCB 81. The clamp 94 may include a body part 940, and an interference part 942 protruding from the outer surface of the body part 940. The condenser 82 may be inserted into the inside of the body part 940, and the clamp 94 may be fixed on the PCB 81 by the interference part 942 interfered by the PCB 81.

The clamps according to the first to ninth embodiments of the present disclosure have a shape for pressing a condenser toward the PCB 81 at the front portion of the condenser to fix the condenser on the PCB 81, whereas the clamp 94 according to the tenth embodiment of the present disclosure fixes the condenser 82 at the rear portion of the condenser 82 where the PCB 81 is located.

The body part 940 may surround a part of the outer surface of the condenser 82. In the rear portion of the body part 940, the interference part 942 may protrude. A part of the body part 940 and the interference part 942 may be inserted into a hole 811 formed in the PCB 81. The interference part 842 may be interfered by the PCB 81 around the hole 811 on the rear surface of the PCB 81. Since the interference part 942 is interfered by the PCB 81, the clamp 94 can be fixed on the PCB 81.

In the front portion of the body part 940, an opening 945 for passing the condenser 82 therethrough can be formed. The diameter D3 of the opening 945 may be smaller than the diameter D4 of the condenser 82. When the condenser 82 is inserted through the opening 945, the ends of the body part 940 forming the opening 945 may be pressed by the condenser 82 and thus pushed in both side directions A1 and A2. After the condenser 82 is completely inserted into the inside of the body part 940, the ends of the body part 940 pushed in the side directions A1 and A2 may return to their original positions before they are pressed. Since the diameter D3 of the opening 945 formed in the body part 940 is smaller than the diameter D4 of the condenser 82, the condenser 82 can be fixed in the body part 940 without deviating from the body part 940.

In the ends of the body part 940 forming the opening 945, fixing parts 941 may be formed. The thickness W5 of each fixing part 941 may be thicker than the thickness W4 of the body part 940. If the condenser 82 is inserted into the inside of the clamp 94, one ends 941a of the fixing parts 941 may press the outer surface of the condenser 82. Accordingly, the condenser 82 may be pressed toward the PCB 81 by the fixing parts 941, and thus fixed in the body part 940 without moving.

The other ends 941b of the fixing part 941 may protrude in the front direction rather than the condenser 82 inserted into the inside of the body part 940. The other ends 941b of the fixing part 941 may support the rear cover 15. Since the rear cover 15 is supported by the other ends 941b of the fixing part 941, spacing between the rear cover 15 and the PCB 81 can be maintained.

In the body part 940, support parts 943 may be formed. The support parts 943 may protrude from the outer surface of the body part 940. If the clamp 94 is installed on the front surface of the PCB 81 such that the interference parts 942 are interfered by the rear surface of the PCB 81, the support parts 943 may press the front surface of the PCB 81. Since the front surface of the PCB 81 is pressed by the support parts 943, it is possible to prevent the clamp 94 installed on the PCB 81 from moving.

FIG. 15 shows a state in which an electronic component is fixed on a PCB by a clamp according to an eleventh embodiment of the present disclosure.

Referring to FIG. 15, details about the configuration of the body part 940, the opening 945 formed in the body part 940, the interference part 942, and the support part 943 of the clamp 94 according to the tenth embodiment of the present disclosure as shown in FIG. 14 can be applied to a clamp 95 according to the eleventh embodiment of the present disclosure.

More specifically, in the clamp 95 according to the eleventh embodiment of the present disclosure, a body part 950 may surround at least one part of the condenser 82 adjacent to the PCB 81. The clamp 95 may include an interference part 952 protruding in the rear direction from the outer surface of the body part 950. Since the interference part 952 is interfered by the PCB 81, the clamp 95 can be fixed on the PCB 81. The interference part 952 may be inserted into the hole 811 formed in the PCB 81 to be interfered by the rear surface of the PCB 81 around the hole 811.

In the front portion of the body part 950, an opening 955 for passing the condenser 82 therethrough may be formed. Similarly to the tenth embodiment of the present disclosure as shown in FIG. 14, the diameter D5 of the opening 955 may be smaller than the diameter D4 of the condenser 82. When the condenser 82 is inserted through the opening 955, the ends of the body part 950 forming the opening 955 may be pressed by the condenser 82 and thus pushed in both side directions A1 and A2. After the condenser 82 is completely inserted into the inside of the body part 940, the ends of the body part 950 pushed in the side directions A1 and A2 may return to their original positions before they are pressed. Since the diameter D5 of the opening 955 formed in the body part 940 is smaller than the diameter D4 of the condenser 82, the condenser 82 can be fixed in the body part 950 without deviating from the body part 950.

At the ends of the body part 950 forming the opening 955, fixing parts 951 may be formed. Similarly to the tenth embodiment of the present disclosure as shown in FIG. 14, one ends 951a of the fixing parts 951 may press the outer surface of the condenser 82 inserted into the inside of the body part 950. Since the outer surface of the condenser 82 is pressed by the fixing parts 951, the condenser 82 can be fixed without moving in the body part 950.

The other ends 951b of the fixing parts 951 may extend toward the rear cover 15. Each of the fixing parts 951 may have a bent shape, and when the clamp 95 is installed on the PCB 81, the other ends 951b of the fixing parts 951 may extend vertically to the rear cover 15. The rear cover 15 may be supported by the other ends 951b of the fixing parts 951. Since the rear cover 15 is supported by the other ends 951b of the fixing parts 951, spacing between the rear cover 15 and the PCB 81 may be maintained.

The body part 950 may include support parts 953. The support parts 953 may protrude from the outer surface of the body part 950. If the clamp 95 is installed on the front surface of the PCB 81 such that the interference parts 952 are interfered by the rear surface of the PCB 81, the support parts 953 may press the front surface of the PCB 81. Since the front surface of the PCB 81 is pressed by the support parts 953, it is possible to prevent the clamp 95 installed on the PCB 81 from moving.

In the rear portion of the body part 950, a spacing part 954 may protrude. The spacing part 954 may protrude more than the interference parts 952, in the rear direction in which the bottom chassis 70 is located, when the clamp 95 is installed on the PCB 81. The PCB 81 may be spaced by a predetermined distance from the bottom chassis 70 by the spacing part 954 extending in the rear direction from the PCB 81.

The above descriptions relate to embodiments in which a condenser is installed on a PCB by the clamp, however, components that can be fixed by the clamp are not limited to a condenser. A part of the connection part extending in the front direction of the PCB 81 to space the PCB 81 from the bottom chassis 70 can be named a "spacing part".

Since electronic components such as a condenser can be easily fixed on a PCB by the clamp, and the clamp also functions as a spacing member, the PCB can be efficiently configured.

It will be apparent to those skilled in the art that various modifications and variations can be made in the present disclosure without departing from the spirit or scope of the inventions. Thus, it is intended that the present disclosure covers the modifications and variations of this invention provided they come within the scope of the appended claims and their equivalents.

The invention claimed is:

1. A clamp for fixing an electronic component to a printed circuit board (PCB), the clamp comprising:

a fixing part including a pressing part provided to surround an opposite portion of the electronic component to a portion facing the PCB and a support part bent from the pressing part and extending linearly toward the PCB;

a first interference part formed at one end of the support part, and configured to be interfered by the PCB;

a connection part extending from the support part, configured to be in a shape of a single rectangular column, and penetrating a hole formed in the PCB;

a second interference part provided in the connection part and configured to be interfered by the PCB; and a spacing part protruding from at least one of the connection part and the fixing part, and wherein the second interference part is a plurality of blades extending from one end of the single rectangular column in a direction in which the fixing part is disposed, the first interference part includes one end contacted to one surface of the PCB and the second interference part includes one end contacted to another surface of the PCB, a width of the support part is greater than a width of the hole and smaller than a width of the one end of the first interference part, and the width of the one end of the first interference part is the same as a width of the one end of the second interference part.

2. The clamp according to claim 1, wherein the fixing part has elasticity to press the electronic component toward the PCB.

3. The clamp according to claim 1, wherein the spacing part is integrated into the fixing part or the connection part.

4. The clamp according to claim 1, wherein a plurality of fixing parts are provided to fix a plurality of electronic components.

5. The clamp according to claim 1, wherein the second interference part is formed at one end of the connection part.

6. The clamp according to claim 1, wherein the second interference part is flexible such that a diameter of the end of the second interference part is able to be reduced by an external force.

7. The clamp according to claim 1, wherein in the fixing part, a hole into which a part of the electronic component is able to be inserted is formed.

8. The clamp according to claim 1, wherein the connection part comprises:

a first connection part formed at one end of the fixing part; and a second connection part formed at another end of the fixing part.

9. The clamp according to claim 8, wherein the fixing part crosses a plurality of electronic components located between the first connection part and the second connection part.

10. The clamp according to claim 9, wherein a portion of the fixing part located between neighboring electronic components of the plurality of electronic components is bent to surround parts of outer surfaces of the neighboring electronic components.

11. A display device comprising:

a rear cover forming a rear outer appearance of the display device;

a bottom chassis on which a backlight unit is rested; and a printed circuit board (PCB) assembly disposed between the rear cover and the bottom chassis, and including a plurality of electronic components and a PCB on which the plurality of electronic components are mounted, wherein the electronic components are mounted on the PCB by a clamp, the clamp comprising:

a pressing part disposed between the electronic components and the rear cover to prevent the electronic components from contacting the rear cover and configured to press the electronic components toward the PCB;

a support part bent from the pressing part and extending linearly toward the PCB;

a spacing part protruding from at least one of the pressing part and the support part, and configured to space the PCB assembly from the rear cover or the bottom chassis;

a first interference part formed at one end of the support part, and configured to be interfered by the PCB;

a connection part extending from the first interference part, configured to be in a shape of a single rectangular column, and penetrating a hole formed in the PCB; and a second interference part including a plurality of blades extending from one end of the connection part in a direction in which the support part is disposed, the second interference part configured to be interfered by the PCB, and wherein the first interference part includes one end contacted to one surface of the PCB and the second interference part includes one end contacted to another surface of the PCB, a width of the support part is greater than a width of the hole and smaller than a width of the one end of the first interference part, and the width of the one end of the first interference part is the same as a width of the one end of the second interference part.

12. The display device according to claim 11, wherein a plurality of pressing parts extend from the support part.

13. The display device according to claim 11, wherein in the pressing part, a hole into which a part of the electronic components is able to be inserted is formed.

14. The display device according to claim 11, wherein the clamp is injection-molded with a material having non-conductivity.

* * * * *